(12) United States Patent
Tajima

(10) Patent No.: US 9,820,376 B2
(45) Date of Patent: Nov. 14, 2017

(54) SHAPE-RETAINING FILM, AND SHAPE-RETAINING-TYPE FLEXIBLE CIRCUIT BOARD PROVIDED WITH SAME SHAPE-RETAINING FILM

(71) Applicant: TATSUTA ELECTRIC WIRE & CABLE CO., LTD., Higashiosaka-shi, Osaka (JP)

(72) Inventor: Hiroshi Tajima, Kizugawa (JP)

(73) Assignee: TATSUTA ELECTRIC WIRE & CABLE CO., LTD., Osaka (JP)

( * ) Notice: Subject to any disclaimer, the term of this patent is extended or adjusted under 35 U.S.C. 154(b) by 0 days.

(21) Appl. No.: 14/894,485

(22) PCT Filed: Apr. 30, 2014

(86) PCT No.: PCT/JP2014/061962
§ 371 (c)(1),
(2) Date: Nov. 27, 2015

(87) PCT Pub. No.: WO2014/192490
PCT Pub. Date: Dec. 4, 2014

(65) Prior Publication Data
US 2016/0135290 A1      May 12, 2016

(30) Foreign Application Priority Data
May 28, 2013    (JP) .................................. 2013-112274

(51) Int. Cl.
*H05K 1/02*      (2006.01)
*H05K 3/28*      (2006.01)

(52) U.S. Cl.
CPC ......... *H05K 1/0281* (2013.01); *H05K 1/0216* (2013.01); *H05K 3/281* (2013.01); *H05K 2201/057* (2013.01)

(58) Field of Classification Search
CPC .......... H05K 1/0281; H05K 2201/057; H05K 2201/056; H05K 2201/2009; H05K 2201/2027; H05K 1/028
See application file for complete search history.

(56) References Cited

U.S. PATENT DOCUMENTS 5,632,551 A * 5/1997 Roney .................. B60Q 1/2696
                                                              257/E25.028
6,395,992 B1   5/2002 Nakayama et al.
(Continued)

FOREIGN PATENT DOCUMENTS

JP          S57193248 U    12/1982
JP          S6134762 U      7/1984
(Continued)

OTHER PUBLICATIONS

International Search Report issued in connection with underlying PCT Application No. PCT/JP2014/061962, Jul. 2014.
(Continued)

*Primary Examiner* — Jeremy C Norris
(74) *Attorney, Agent, or Firm* — KMF Patent Services, PLLC; Kenneth M. Fagin; S. Peter Konzel

(57) ABSTRACT

A shape-retaining film which allows a flexible wiring board to retain its shape after the flexible wiring board is deformed by bending or the like, and a shape-retaining flexible wiring board including the shape-retaining film, is disclosed herein. A shape-retaining film includes a plastic-deformable metal layer and an adhesive layer which is formed on one surface side (lower side) of the metal layer 3 and is joined with a flexible wiring board. The shape-retaining film makes it possible to retain the shape of a deformed flexible wiring board. With this arrangement, the occurrence of a repellent force in the deformed flexible wiring board is prevented.

10 Claims, 5 Drawing Sheets

(56) References Cited

U.S. PATENT DOCUMENTS

| | | | |
|---|---|---|---|
| 8,071,882 B2 * | 12/2011 | Okajima | H05K 1/028 174/250 |
| 2004/0178496 A1 * | 9/2004 | Rapport | H01L 23/3114 257/723 |
| 2007/0259159 A1 | 11/2007 | Yeh et al. | |
| 2009/0317591 A1 | 12/2009 | Sato et al. | |

FOREIGN PATENT DOCUMENTS

| | | |
|---|---|---|
| JP | H03129894 A | 6/1991 |
| JP | 2000174399 A | 6/2000 |
| JP | 2002335086 | 11/2002 |
| JP | 2005183536 A | 7/2005 |
| JP | 2007234734 | 9/2007 |
| JP | 2007294918 | 11/2007 |
| JP | 2010287780 A | 12/2010 |
| JP | 2013077842 | 4/2013 |
| TW | 200803664 A | 1/2008 |
| WO | WO2008032770 A1 | 3/2008 |
| WO | WO 2014/192490 | 4/2014 |

OTHER PUBLICATIONS

IPRP and Written Opinion from corr'ing PCT app'n PCT/JP2014/061962, Dec. 2015.
Office Action dated May 9, 2017 in corresponding Japanese patent application 2015-519752.
Office Action dated Mar. 16, 2017 in connection with TW 103115565.

* cited by examiner

SHAPE-RETAINING FILM, AND SHAPE-RETAINING-TYPE FLEXIBLE CIRCUIT BOARD PROVIDED WITH SAME SHAPE-RETAINING FILM

CROSS-REFERENCE TO RELATED APPLICATIONS

This application is the U.S. National Phase of International Application Number PCT/JP2014/061962 filed Apr. 30, 2014, the contents of which are incorporated herein by reference. That application was based on Japanese patent application number 2013-112274 filed May 28, 2013, the contents of which are incorporated by reference and the priority benefit of which is claimed.

TECHNICAL FIELD

The present invention relates to a film to be adhered to a flexible wiring board mounted on an electronic apparatus and a flexible wiring board including the film, and particularly relates to retaining of the shape of a deformed flexible wiring board.

BACKGROUND

Electronic apparatuses such as mobile phones and personal computers have been required to be slimmed and downsized. For this reason, printed wiring boards in an electronic apparatus are required to be mounted in high density. On this account, as a printed wiring board, e.g., a flexible wiring board recited in PTL 1 which can be deformed to bend has been widely used.

CITATION LIST

Patent Literature

[PTL 1] Japanese Unexamined Patent Publication No. 2007-234734

SUMMARY OF INVENTION

Technical Problem

In regard to the above, because a deformed flexible wiring board exerts a repellent force to return to the state before the deformation, various disadvantages may occur. For example, one of the disadvantages is as follows: plural flexible wiring boards are joined with one another in an electronic apparatus, and connection failure may occur at each joint between the flexible printed boards because each flexible wiring board may return to the state before the deformation. In particular, such a connection failure above tends to occur when each joint is formed to be thin in order to reduce the thickness of the electronic apparatus.

The present invention has been done to solve the problem above, and an object of the present invention is to provide a shape-retaining film which retains the shape of a deformed flexible wiring board due to bending or the like, and a shape-retaining flexible wiring board including the shape-retaining film.

Technical Problem (1) A shape-retaining film of the present invention is a shape-retaining film including: a plastic-deformable metal layer; and an adhesive layer formed on one surface side of the metal layer and to be joined with a flexible wiring board.

In an electronic apparatus such as a mobile phone, a flexible wiring board may be provided after being deformed, e.g., bended. According to the configuration above, because the shape-retaining film can be joined with the flexible wiring board by the adhesive layer, it is possible to effectively prevent the deformed flexible wiring board from returning to the state before the deformation due to the plastic-deformable metal layer. As such, with the shape-retaining film, the shape of the deformed flexible wiring board is retained. On account of the above, the generation of the repellent force in the deformed flexible wiring board is prevented. On this account, the occurrence of a connection failure at junctions of shape-retaining flexible wiring boards formed of shape-retaining films and a flexible wiring boards are suitably prevented.

(2) The metal layer may be mainly made of at least one of copper, silver, nickel, and aluminum.

The configuration above makes it possible to form a plastic-deformable metal layer, and hence the shape retaining effect of the flexible wiring board thanks to the shape-retaining film is enhanced.

(3) The thickness of the metal layer may be 0.1 µm to 12 µm.

Setting the thickness of the metal layer to be 0.1 µm or greater is preferable for exerting the shape retaining capability, whereas setting the thickness of the metal layer to be 12 µm or less is preferable for the workability in the bending. When the metal layer is thicker than 12 µm, the flexible wiring board provided with the shape-retaining film is too thick, and hence a large force is required to bend the flexible wiring board. With the configuration above, a metal layer which exerts the shape retaining capability and is plastically deformable is formed, and the flexible wiring board on which the shape-retaining film is pasted is easily bendable, i.e., the workability in the bending is improved.

(4) The adhesive layer may be conductive.

According to the configuration above, only by joining the shape-retaining film with the flexible wiring board, the shape of the deformed flexible wiring board is retained, and an electric field wave, a magnetic field wave, an electromagnetic wave, and static electricity which radiate from the flexible wiring board to the outside and an electric field wave, a magnetic field wave, an electromagnetic wave, and static electricity which radiate from the outside to the flexible wiring board are suitably blocked.

(5) In the metal layer, a protective layer may be formed on a side opposite to a side where adhesive layer is provided.

According to the configuration above, the metal layer is protected by the protective layer, and hence the deterioration of the metal layer over time is suitably prevented.

(6) In the metal layer, on a side opposite to a side where the adhesive layer is provided, another adhesive layer may be formed.

As the adhesive layer is formed on both sides of the metal layer, the shape-retaining film can be joined with the flexible wiring board by one adhesive layer, whereas the shape-retaining film can be joined with another part in a housing of an electronic apparatus by the other adhesive layer. On this account, as the bended shape-retaining flexible wiring board is joined with another part in the housing of the electronic apparatus by means of the other adhesive layer, the occurrence of the repellent force in the shape-retaining flexible wiring board is further restrained, and the shape retaining effect is improved.

(7) The another adhesive layer formed on the side opposite to the side where the adhesive layer is provided of the metal layer may be conductive.

According to the configuration above, because the adhesive layer formed on the side opposite to the side of the adhesive layer joined with the flexible wiring board on the metal layer is conductive, a shielding effect may be exerted when the shape-retaining film is joined with an external ground via this adhesive layer.

(8) The metal layer may be subjected to a corrosion resistance surface treatment.

According to the configuration above, it effectively prevents the metal layer from being corroded due to a thermal treatment or temporal deterioration.

(9) In a shape-retaining flexible wiring board of the present invention, the shape-retaining film above is joined with the flexible wiring board above by the adhesive layer above.

According to this configuration, the effects similar to those of the features (1) to (8) above are achieved.

DESCRIPTION OF EMBODIMENTS

Figure 1:
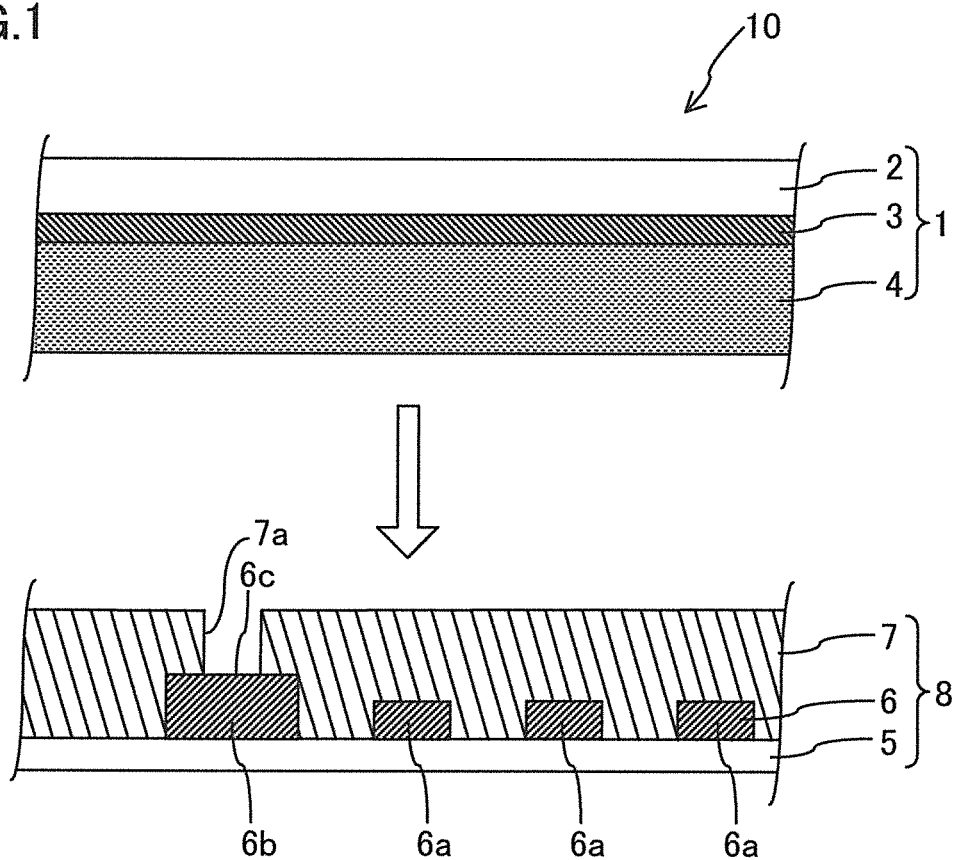
FIG. 1 is a partial cross section of a shape-retaining film of an embodiment and a flexible wiring board with which this shape-retaining film is joined.

The following will describe a preferred embodiment of the present invention with reference to figures.
(Overall Configuration of Shape-Retaining Flexible Wiring Board 10)

To begin with, with reference to FIG. 1 and FIG. 2, a shape-retaining flexible wiring board 10 of the present embodiment will be described.

The shape-retaining flexible wiring board 10 is formed in such a way that a shape-retaining film 1 and a flexible wiring board 8 are joined with each other by an adhesive layer 4, and is therefore able to retain the shape after being deformed by bending or the like. To be more specific, in the shape-retaining flexible wiring board 10, the shape-retaining film 1 is joined with the upper surface of the flexible wiring board 8. The flexible wiring board 8 is a flexible and deformable printed wiring board which is, for example, bendable.

The shape-retaining film 1 includes a plastic-deformable metal layer 3 and an adhesive layer 4 which is formed on one surface side (lower surface side) of the metal layer 3 and to be joined with the flexible wiring board. Because the metal layer 3 is plastically deformable, the metal layer 3 retains the deformed shape of the shape-retaining flexible wiring board 10 after the shape-retaining flexible wiring board 10 is deformed.

In addition to the above, because the adhesive layer 4 is conductive, the metal layer 3 is electrically conducted with a ground circuit 6b of the flexible wiring board 8 when the shape-retaining film 1 is joined with the flexible wiring board 8 via the adhesive layer 4. With this, the shape-retaining film 1 of the present embodiment also functions as a shield film which is able to suitably block an electric field wave, a magnetic field wave, an electromagnetic wave, and static electricity which radiate from the flexible wiring board 8 to the outside and an electric field wave, a magnetic field wave, an electromagnetic wave, and static electricity which radiate from the outside to the flexible wiring board 8. As such, the shape-retaining film 1 effectively prevents the signal circuit 6a of the flexible wiring board 8 from, for example, being influenced by noise.

On one surface side (upper surface side) of the metal layer 3 opposite to the adhesive layer 4 side (lower side), a protective layer 2 is formed to protect the metal layer 3. This effectively prevents the metal layer 3 from being deteriorated over time.

The following will specifically describe each configuration.
(Configuration of Shape-Retaining Film 1: Metal Layer 3)

The metal layer 3 is configured to be plastically deformable as described above. To be more specific, the metal layer 3 is mainly made of at least one type of plastic metals such as copper, silver, nickel, and aluminum. This effectively prevents a shape-retaining flexible wiring board 10 from exerting a repellent force when the deformed shape-retaining flexible wiring board 10 is mounted in an electronic apparatus. With this, a connection failure due to the generation of the repellent force above is effectively prevented at junctions between shape-retaining flexible wiring boards 10 in the electronic apparatus.

In addition to the above, the workability when the shape-retaining flexible wiring board 10 being mounted is improved. For example, when the shape-retaining flexible wiring board 10 is bended and then mounted in an electronic apparatus or like, the shape-retaining flexible wiring board 10 maintains the bended state due to the good shape retaining property of the shape-retaining film 1, even if the bended state is not maintained by an operator. This reduces the workload in mounting of the shape-retaining flexible wiring board 10 in the electronic apparatus.

To provide a sufficiently plastic metal layer 3, the thickness of the metal layer 3 is preferably 0.1 µm or greater, more preferably 1 µm or greater, and even more preferably 2 µm or greater. To facilitate the bending of the shape-retaining flexible wiring board 10, the thickness of the metal layer 3 is preferably 12 µm or less, more preferably 9 µm or less, and even more preferably 6 µm or less.

The metal layer 3 is preferably a metal foil. This makes it possible to easily obtain a metal layer with desired thickness, and to obtain better shielding property than in a thin-film metal layer 3 formed by vacuum deposition.

Even more preferably, the metal layer 3 is formed by rolling. This allows the shape-retaining film 1 to have a good shape retaining property. The thickness of the metal layer 3 may be adjusted to fall within the ranges above by means of etching.

The metal layer 3 is not limited to the metal foil formed by rolling, and may be a metal foil formed by electrolysis (e.g., a special electro-deposited copper foil), vacuum deposition, sputtering, CVD, MO (metal organic), or plating, or the like.

(Configuration of Shape-Retaining Film 1: Adhesive Layer 4)

The adhesive layer 4 may be made of an isotropic or anisotropic conductive adhesive formed by the addition of conductive fillers. When the adhesive layer 4 is made of the isotropic conductive adhesive, an electrically conductive state is achieved in all directions in three dimensions constituted by thickness direction, width direction, and longitudinal direction.

In the meanwhile, when the adhesive layer 4 is made of the anisotropic conductive adhesive, an electrically conductive state is achieved in only two-dimensional direction constituted by thickness direction. In this way, when the adhesive layer 4 is made of the anisotropic conductive adhesive, the flexible wiring board exhibits good transmission property as compared to cases where the adhesive layer 4 is made of the isotropic conductive adhesive.

The thickness of the adhesive layer 4 is preferably 2 μm or greater, and more preferably 3 μm or greater. Furthermore, the thickness of the adhesive layer 4 is preferably 15 μm or less, and more preferably 9 μm or less.

The adhesive layer 4 is composed of adhesive resin such as thermoplastic resin or thermosetting resin. As thermoplastic resin, polystyrene-based resin, vinyl acetate-based resin, polyester-based resin, polyethylene-based resin, polypropylene-based resin, polyamide-based resin, rubber-based resin, and acrylic-based resin may be used. As thermosetting resin, phenol resin, epoxy resin, urethane resin, melamine resin, and alkyd resin may be used. The adhesive may be entirely a single type of the resin above or may be a mixture of plural types of the resins above. The adhesive may further include a flame retardant and a tackifier. Examples of the tackifier include fatty acid hydrocarbon resin, C5/C9 mixed resin, rosin, rosin derivative, terpene resin, aromatic-based hydrocarbon resin, and thermal reactive resin.

Examples of the adhesive resin include thermosetting resin, thermoplastic resin, ultraviolet-curable resin, and adhesive resin which is reworkable. In consideration of the processing of the flexible wiring board, the adhesive resin is preferably thermosetting resin, thermoplastic resin, or adhesive resin.

The conductive fillers added to the adhesive layer 4 are entirely or partially formed of a metal material. For example, the conductive fillers may be made of copper powder, silver powder, nickel powder, silver-coated copper powder (Ag-coated Cu powder), gold-coated copper powder, silver-coated nickel powder (Ag-coated Ni powder), and gold-coated nickel powder. These metal powders are formed by atomization, carbonylation, or the like. Apart from the above, particles formed by coating metal powder with resin or particles formed by coating resin with metal powder may be used. To the adhesive layer 4, one or more type of conductive fillers may be added and mixed. The conductive fillers are preferably Ag-coated Cu powder or Ag-coated Ni powder. This is because conductive particles with stable conductivity may be obtained from inexpensive materials.

The ratio of the conductive fillers to the adhesive resin is preferably 10 parts by weight at the minimum relative to 100 parts by weight of the adhesive resin, and 400 parts by weight at the maximum relative to 100 parts by weight of the adhesive resin. When the adhesive layer 8b is made of the anisotropic conductive adhesive, the ratio of the conductive fillers to the adhesive resin is preferably 10 parts by weight at the minimum relative to 100 parts by weight of the adhesive resin, and 180 parts by weight at the maximum relative to 100 parts by weight of the adhesive resin. When the adhesive layer 8b is made of the isotropic conductive adhesive, the ratio of the conductive fillers to the adhesive resin is preferably 150 parts by weight at the minimum relative to 100 parts by weight of the adhesive resin, and 250 parts by weight at the maximum relative to 100 parts by weight of the adhesive resin. The average particle diameter of the conductive fillers preferably falls within the range of 2 μm to 20 μm, and an optimum value may be chosen in accordance with the thickness of the adhesive layer 4. The shape of the metal filler may be spherical, needle-shaped, fiber-shaped, flake-shaped, or dendrite-shaped.

(Configuration of Shape-Retaining Film 1: Protective Layer 2)

As described above, the protective layer 2 is provided for protecting the metal layer 3 and is formed of, for example, a cover film and a coating layer made of insulating resin. The cover film may be made of engineering plastics. Examples of the engineering plastics include polypropylene, cross-linked polyethylene, polyester, polybenzimidazole, aramid, polyimide, polyimidoamide, polyetherimide, polyphenylene sulfide (PPS), and polyethylene naphthalate (PEN). When heat resistance is not required so much, a polyester film is preferred for its inexpensiveness. When fire retardance is required, a polyphenylene sulfide film is preferred. When heat resistance is further required, an aramid film or a polyimide film is preferred.

The insulating resin is resin having an insulating property. Examples of insulating resin are thermosetting resin, ultraviolet curing resin, and thermoplastic resin which are described below. Examples of the thermosetting resin include phenol resin, acrylic resin, epoxy resin, melamine resin, silicon resin, and acryl-modified silicon resin. Examples of the ultraviolet curing resin include epoxy acrylate resin, polyester acrylate resin, and methacrylate modifications thereof. The method of curing may be thermosetting, ultraviolet curing, electron beam curing, or the like. Any method may be employed as long as the curing is achieved. Examples of the thermoplastic resin composition include styrene-based resin composition, vinyl acetate-based resin composition, polyester-based resin composition, polyethylene-based resin composition, polypropylene-based resin composition, imide-based resin composition, and acryl-based resin composition.

The thickness of the protective layer 2 is preferably 1 μm or greater, and more preferably 3 μm or greater. The thickness of the protective layer 2 is preferably 10 μm or less, and more preferably 7 μm or less. The protective layer 2 is not limited to a single layer. For example, the protective layer 2 may be formed of two or more layers which are different in composition. According to need, the protective layer 2 may include a hardening accelerator, a tackifier, an antioxidant, a pigment, a dye, a plasticizer, an ultraviolet absorber, an antifoaming agent, a leveling agent, filler, a flame retardant, a viscosity control agent, an antiblocking agent, or the like.

(Configuration of Flexible Wiring Board 8)

The flexible wiring board 8 is formed by laminating a base film 5, a printed circuit 6, and an insulating film 7 in order. As shown in FIG. 1, the surface of the printed circuit 6 is formed of a signal circuit 6a and a ground circuit 6b. The signal circuit 6a and the ground circuit 6b are formed, for example, in such a way that wiring patterns are formed by etching conductive material.

The ground circuit 6b is a pattern which maintains a ground potential. Except at least a part (non-insulating part 6c) thereof, the ground circuit 6b is covered with the insulating film 7. At a part above the non-insulating part 6c in the insulating film 7, a conducting hole 7a is formed. This allows a part of the adhesive layer 4 to enter the conducting hole 7a when the shape-retaining film 1 is joined with the flexible wiring board 8, with the result that the ground circuit 6b and the metal layer 3 are electrically connected with each other.

The signal circuit 6a is provided for transmitting a signal with a predetermined frequency. In the present embodiment, a signal with a frequency of 10 MHz to 10 GHz is transmitted within the signal circuit 6a.

The base film 5 and the printed circuit 6 may be joined by using an adhesive, or may be joined without using an adhesive, i.e., in the same manner as a non-adhesive type copper clad laminate. The insulating film 7 may be laminated by pasting a flexible insulating film by using an adhesive, or may be laminated by performing a series of processes, i.e., application, drying, exposure, development, and thermal treatment of photosensitive insulating resin. When the insulating film 7 is pasted by using an adhesive, a conducting hole 7a is formed also at a part of the adhesive above the ground circuit 6b.

Furthermore, the flexible wiring board film 8 is suitably selected from a one-sided FPC in which a printed circuit is provided only on one side of the base film 5, a double-sided FPC in which printed circuits are provided on the both sides of the base film 5, a multilayer FPC in which these types of FPCs are laminated, a Flexboard (registered trademark) including a multilayer mounting portion and a cable portion, and a flexible rigid board in which members forming a multilayer portion as hard part.

The base film 5 and the insulating film 7 are both made of engineering plastics. Examples of the engineering plastics are resins such as polyethylene terephthalate, polypropylene, cross-linked polyethylene, polyester, polybenzimidazole, polyimide, polyimidoamide, polyetherimide, and polyphenylene sulfide (PPS). When heat resistance is not required so much, an inexpensive polyester film is preferred. When fire retardance is required, a polyphenylene sulfide film is preferred. When heat resistance is further required, a polyimide film is preferred.

The thickness of the base film 5 is preferably 10 µm or greater, and more preferably 20 µm or greater. The thickness of the base film 5 is preferably 60 µm or less, and more preferably 40 µm or less.

The thickness of the insulating film 7 is preferably 10 µm or greater, and more preferably 20 µm or greater. The thickness of the insulating film 7 is preferably 60 µm or less, and more preferably 40 µm or less.

(Method of Manufacturing Shape-Retaining Film 1)

The following will describe an example of a method of manufacturing the shape-retaining film 1 of the present embodiment.

To begin with, copper is provided between a pair of rotating rollers and is rolled to be as thick as first size. This first size is preferably 3 µm or greater, more preferably 6 µm or greater, and even more preferably 9 µm or greater. The first size is preferably 35 µm or less, more preferably 18 µm or less, and even more preferably 12 µm or less.

The copper foil rolled to be as thick as first size is etched to be as thick as second size, with the result that the metal layer 3 is formed. This second size is preferably 0.1 µm or greater, and more preferably 1 µm or greater. The second size is preferably 12 µm or less, and more preferably 6 µm or less. To be more specific, for example, the copper foil of first size (e.g., 6 µm) is immersed into an etching solution formed of sulfuric acid or hydrogen peroxide to be a copper foil of second size (e.g., 2 µm). The etched copper foil surface is preferably modified to have better adhesiveness by performing a plasma treatment thereto.

In addition to the above, one-side surface of the metal layer 3 is coated with the adhesive layer 4. To the other-side surface of the formed metal layer 3, a protective layer 2 is formed by pasting or coating.

(Method of Manufacturing Shape-Retaining Flexible Wiring Board 10)

To begin with, the insulating film 7 of the flexible wiring board 8 is perforated by laser processing or the like, so that the conducting hole 7a is formed. As a result, a part of the ground circuit 6b is exposed to the outside through the conducting hole 7a.

Subsequently, the shape-retaining film 1 is joined with the surface of the insulating film 7 of the flexible wiring board 8. In this joining, the flexible wiring board 8 and the shape-retaining film 1 are pressed onto each other in the up-down direction by a pressing machine while the shape-retaining film 1 is heated by a heater. With this, the adhesive layer 4 of the shape-retaining film 1 is softened by the heat of the heater, and is joined with the surface of the insulating film 7 by the press of the pressing machine. At this stage, a part of the softened adhesive layer 4 fills the conducting hole 7a. On this account, the part of the ground circuit 6b exposed through the conducting hole 7a is joined with the filled adhesive layer 4. As a result, the ground circuit 6b and the metal layer 3 are electrically connected with each other via the adhesive layer 4, and the manufacturing of the shape-retaining flexible wiring board 10 is completed.

The embodiment of the present invention has been described. The present invention, however, is not limited to the embodiment above.

The detailed description of the present invention provided hereinabove mainly focused on characteristics thereof for the purpose of easier understanding; however, the scope of the present invention shall be construed as broadly as possible, encompassing various forms of other possible embodiments, and therefore the present invention shall not be limited to the above description. Modifications of the embodiment above will be described below.

Figure 3:
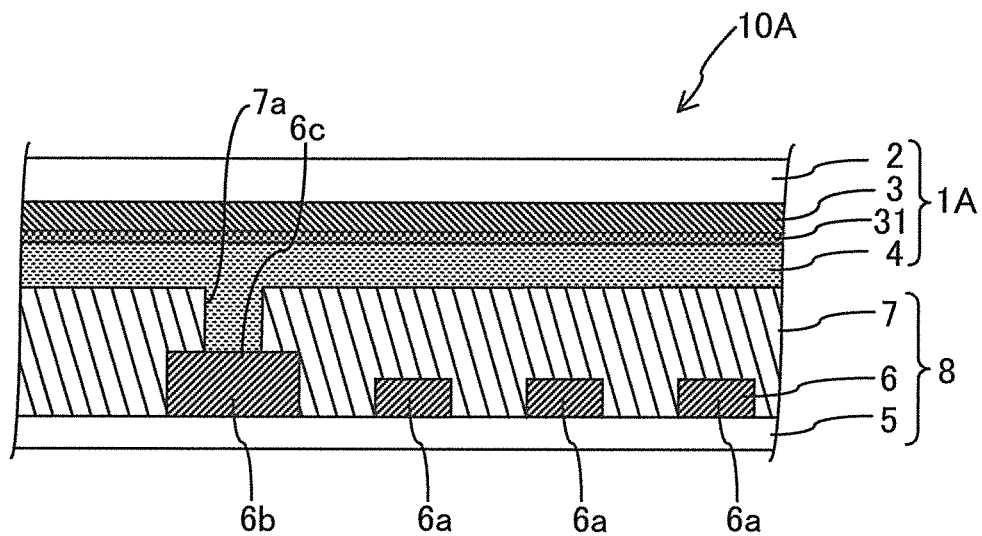
FIG. 3 is a partial cross section of a shape-retaining flexible wiring board of a modification of the present embodiment.

(Modifications) (1) The metal layer 3 may be subjected to a corrosion resistance surface treatment. For example, as in a shape-retaining flexible wiring board 10A of the modification shown in FIG. 3, on a surface of the metal layer 3 (e.g., the lower surface), a plating layer 31 with good corrosion resistance made of a metal material (e.g., noble metal such as gold and silver, or nickel) may be formed. This effectively prevents the metal layer 3 from being corroded due to a thermal treatment or temporal deterioration. When the metal layer 3 is corroded, the resistance value is increased and the shielding effect is deteriorated. In the modification, because the plating layer 31 is formed on the surface of the metal layer 3, the corrosion of the metal layer 3 is prevented and the state of low electric resistance may be maintained for a long time. On this account, the shielding effect of the shape-retaining film 1A may be maintained for a long time. In FIG. 3, the plating layer 31 is formed on the lower surface of the metal layer 3, but the plating layer 31 may be formed on the upper surface or on each of the upper surface and the lower surface.

A method of forming the plating layer 31 is as follows. For example, as the upper surface of a large-sized metal layer 3 is immersed into a plating bath, the plating layer 31 is formed. Thereafter, the adhesive layer 4 is pasted or coated onto the lower surface of the metal layer 3, whereas the protective layer 2 is pasted or coated onto the upper surface of the plating layer 31. As the large-sized shape-retaining film 1A formed in this way is longitudinally and laterally cut into films each with a predetermined size, plural shape-retaining films 1A are formed.

Figure 4:
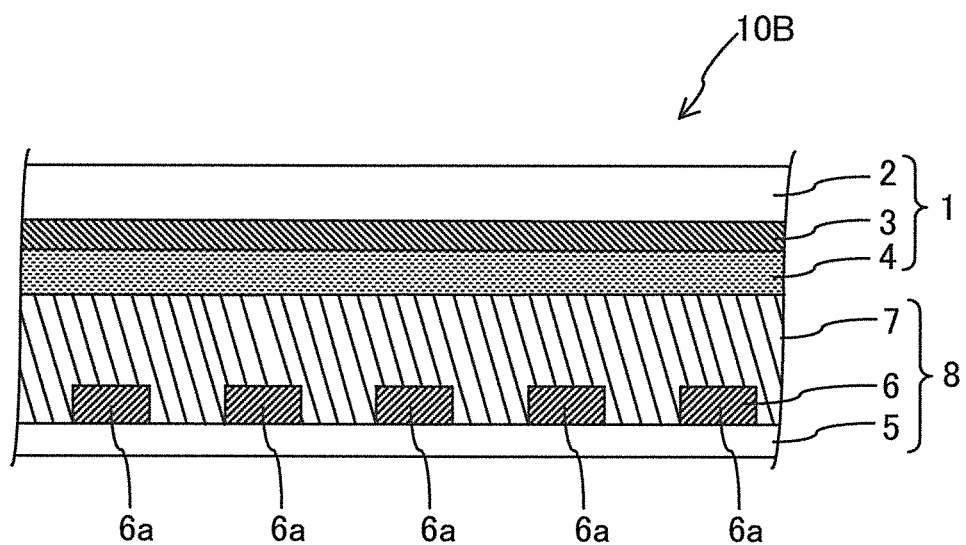
FIG. 4 is a partial cross section of a shape-retaining flexible wiring board of another modification of the present embodiment.

(2) Alternatively, the adhesive layer 4 may not be conductive, and in the shape-retaining film. 1 the metal layer 3 and the ground circuit 6b may not be electrically connected with each other. In the shape-retaining flexible wiring board 10B of this modification, the ground circuit 6b may not be formed as shown in FIG. 4.

Figure 5:
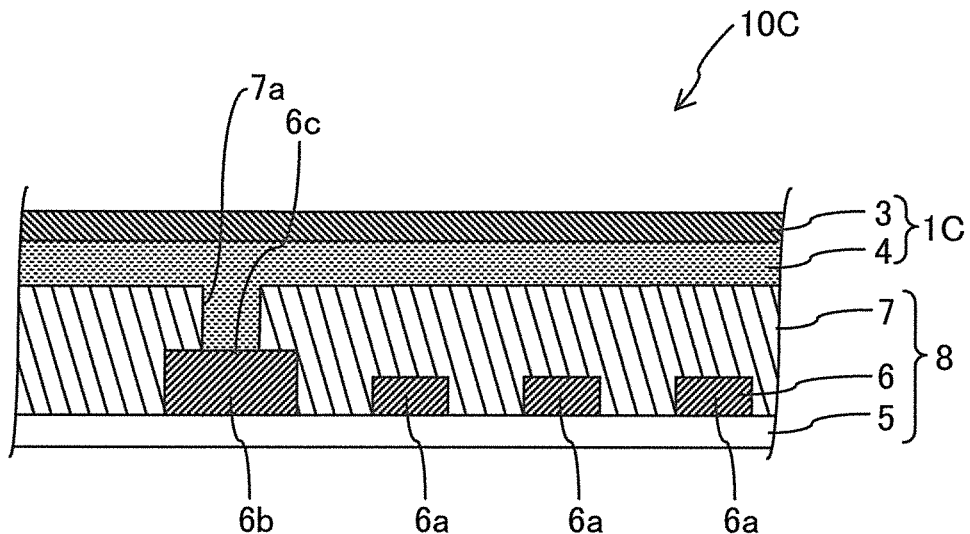
FIG. 5 is a partial cross section of a shape-retaining flexible wiring board of another modification of the present embodiment.

(3) Furthermore, as in a shape-retaining flexible wiring board 10C of a modification shown in FIG. 5, the protective layer 2 may not be formed on the shape-retaining film 1C.

Figure 2:
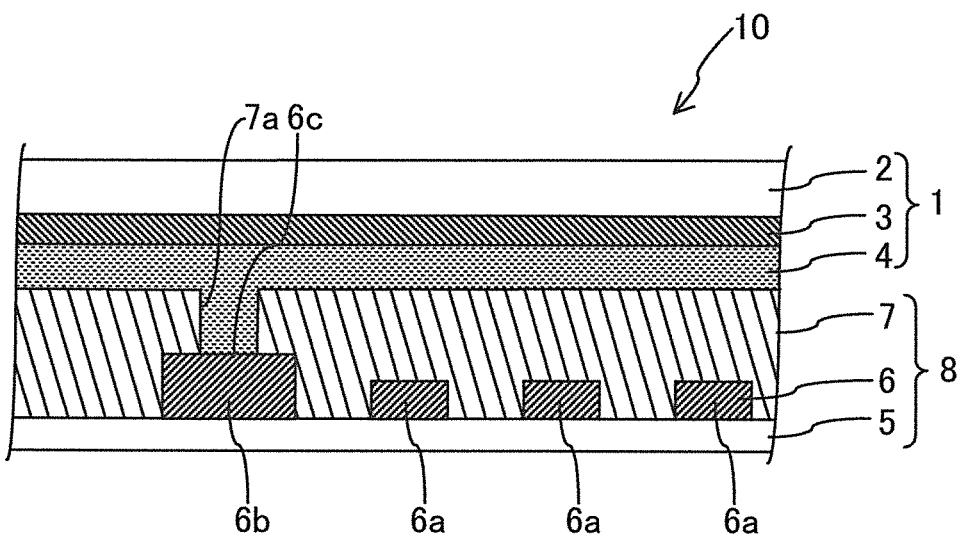
FIG. 2 is a partial cross section of a shape-retaining flexible wiring board of the present embodiment.

(4) Furthermore, in the shape-retaining flexible wiring board 10 of the present embodiment shown in FIG. 1 and FIG. 2, the shape-retaining film 1 is pasted onto one surface of the flexible wiring board 8. The disclosure, however, is not limited to this configuration. For example, the shape-retaining film 1 may be pasted onto both surfaces of the flexible wiring board 8.

Figure 6A:
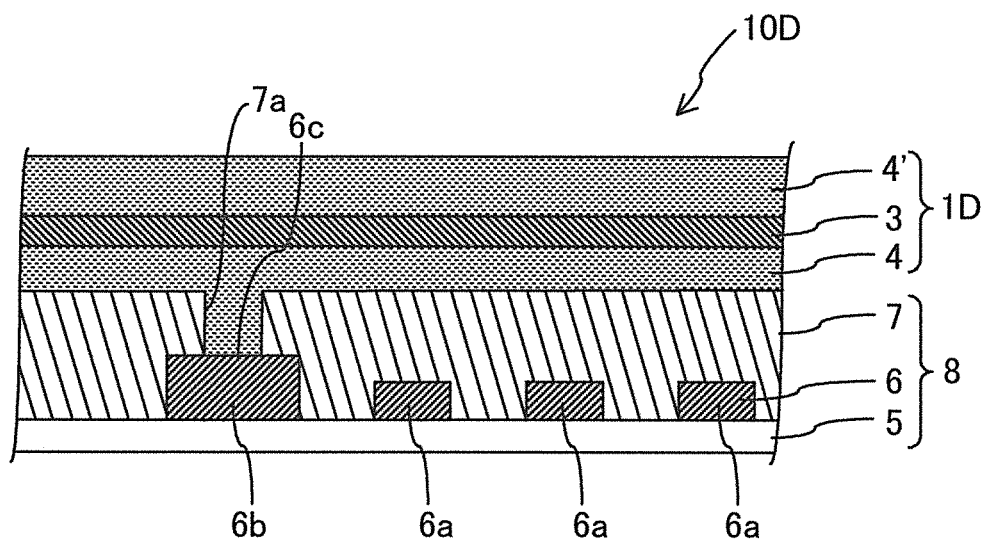
FIG. 6A is a partial cross section of a shape-retaining flexible wiring board of another modification of the present embodiment.
Figure 6B:
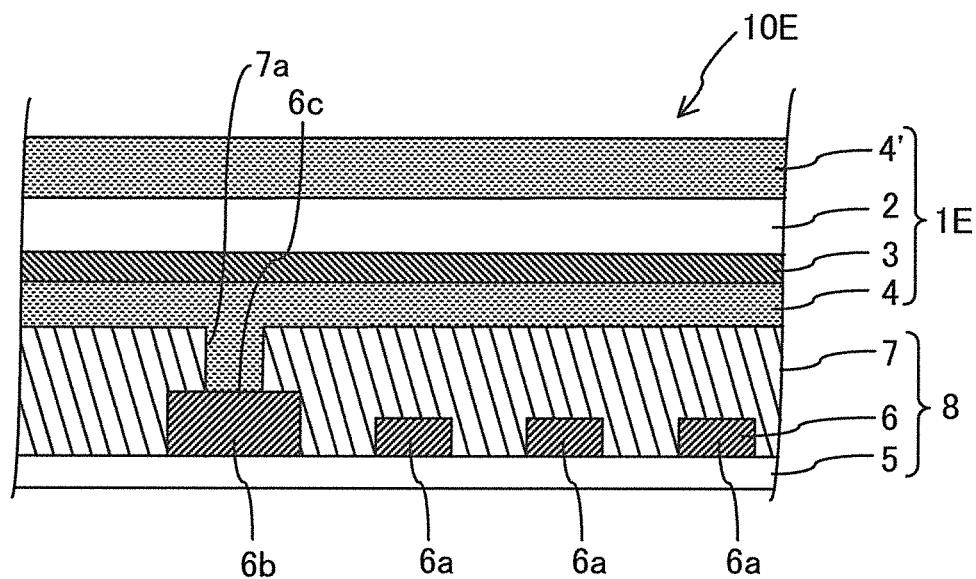
FIG. 6B is a partial cross section of a shape-retaining flexible wiring board of another modification of the present embodiment.

(5) In addition to the above, while in the present embodiment shown in FIG. 1 and FIG. 2 the shape-retaining film 1 is configured such that the protective layer 2 is formed on a surface of the metal layer 3 opposite to the adhesive layer 4 side, but an adhesive layer 4' may be further formed in place of the protective layer 2 as in a shape-retaining film 1D in a shape-retaining flexible wiring board 10D shown in FIG. 6A. Furthermore, an adhesive layer 4' may further be formed on the protective layer 2 as in a shape-retaining film 1E in a shape-retaining flexible wiring board 10E shown in FIG. 6B. When the adhesive layers 4 and 4' are formed on the respective sides of the metal layer 3, the shape-retaining film 1D, 1E can be joined with the flexible wiring board 8 by the adhesive layer 4 and can be joined with another part in the housing of the electronic apparatus by the adhesive layer 4'. On this account, as the bended shape-retaining flexible wiring board 10D, 10E is joined with another part in the housing of the electronic apparatus by means of the adhesive layer 4', the occurrence of the repellent force in the shape-retaining flexible wiring board 10D, 10E is further restrained, and the shape retaining effect is improved. The adhesive layer 4' (which is equivalent to an adhesive layer formed on a side opposite to an adhesive layer side in the present invention) is not always required to be conductive as in the case of the adhesive layer 4, but is preferably conductive. When the adhesive layer 4' is conductive, the shielding effect is exerted when the shape-retaining film 1D, 1E is joined with an external ground via the adhesive layer 4'. The adhesive layer 4' may be identical with the above-described adhesive layer 4, but is preferably ultraviolet-curable or adhesive. Alternatively, in the configuration shown in FIG. 6A and FIG. 6B, a plating layer 31 may be further provided as indicated in (1).

The terms and phraseology used in the present specification are adopted solely to provide specific illustration of the present invention, and in no case should the scope of the present invention be limited by such terms and phraseology. Further, it will be obvious to those skilled in the art that the other structures, systems, methods and the like are possible, within the spirit of the invention described in the present specification. The description of claims therefore shall encompass structures equivalent to the present invention, unless otherwise such structures are regarded as to depart from the spirit and scope of the present invention. To fully understand the object and effects of the present invention, it is strongly encouraged to sufficiently refer to disclosures of documents already made available.

EXAMPLES

Figure 7:
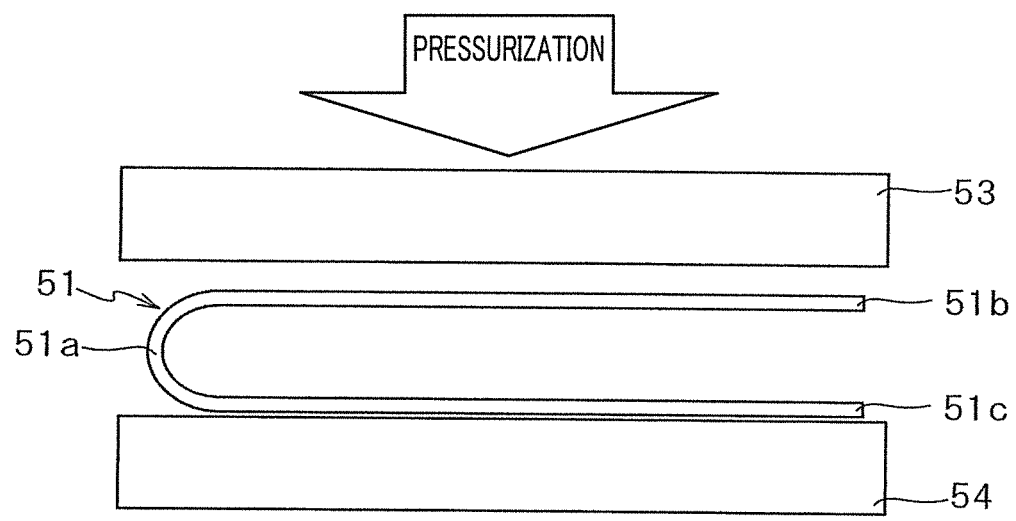
FIG. 7 shows an experimental apparatus which is configured to measure a shape retaining property of a metal layer in the shape-retaining film.

By using a testing device shown in FIG. 7, the shape retaining property (plasticity) of a metal layer in a shape-retaining film was measured. In this shape retaining property test, a sample 51 in which a shape-retaining film with a predetermined thickness was formed on an upper surface or both surfaces of a polyimide film with 50 μm in thickness, 10 mm in length, and 100 mm in width was prepared. In addition to the above, the adhesive layer was 10 μm in thickness and the protective layer was 5 μm in thickness.

To be more specific, in the test, as a sample 51, Example A1 in which a shape-retaining film having a silver metal layer 0.1 μm thick and formed by vacuum deposition was formed on the upper surface of a polyimide film; Example A2 in which a shape-retaining film having a copper rolled foil (metal layer) 6 μm thick was formed on the upper surface of a polyimide film; Example A3 in which a shape-retaining film having a copper (tough pitch copper) rolled foil (metal layer) 2 μm thick was formed on the upper surface of a polyimide film; and Example A4 in which a shape-retaining film having a copper rolled foil (HA foil made of JX Nippon Mining & Metals Corp) 2 μm thick was formed on the upper surface of a polyimide film, were prepared.

Furthermore, in the test, as a sample 51, Example A5 in which a shape-retaining film having a copper electrolytic foil (metal layer) 1 μm thick was formed on the upper surface of a polyimide film, Example A6 in which a shape-retaining film having a copper electrolytic foil (metal layer) 2 μm thick was formed on the upper surface of a polyimide film, and Example A7 in which a shape-retaining film having a copper electrolytic foil (metal layer) 5 μm thick was formed on the upper surface of a polyimide film were prepared.

In addition to the above, in the test, as a sample 51, Example B1 in which a shape-retaining film having a silver metal layer 0.1 μm thick was formed on both surfaces of a polyimide film, Example B2 in which a shape-retaining film having a copper rolled foil (metal layer) 6 μm thick was formed on both surfaces of a polyimide film, Example B3 in which a shape-retaining film having a copper (tough pitch copper) rolled foil (metal layer) 2 μm thick was formed on both surfaces of a polyimide film, and Example B4 in which a shape-retaining film having a copper rolled foil (an HA foil made of JX Nippon Mining & Metals Corp. metal layer) 2 μm thick was formed on both surfaces of a polyimide film, were prepared.

In addition to the above, in the test, as a sample 51, Example B5 in which a shape-retaining film having a copper electrolytic foil (metal layer) 1 μm thick was formed on both surfaces of a polyimide film, Example B6 in which a shape-retaining film having a copper electrolytic foil (metal layer) 2 μm thick was formed on both surfaces of a polyimide film, and Example B7 in which a shape-retaining film having a copper electrolytic foil (metal layer) 5 μm thick was formed on both surfaces of a polyimide film, were prepared.

In addition to the above, in the test, furthermore, as a sample 51, Comparative Example C1 in which a polyimide film 51 without shape-retaining film was prepared.

The formation of the shape-retaining film on the upper surface or both surfaces of the polyimide film in the sample 51 was performed as follows. While the shape-retaining film is provided on one surface of the polyimide film, the polyimide film was pressurized for 30 minutes in an atmosphere of 170° C. and with a pressurizing force of 3 MPa (pressuring process). As this pressuring process was performed for the upper surface or both surfaces of the polyimide film, the shape-retaining film was formed on the upper surface or both surfaces of the polyimide film.

In the test, the shape retaining properties of Examples A1 to A7 and B1 to B7 and Comparative Example C1 were measured. To be more specific, as shown in FIG. 7, the sample 51 was placed on a substrate 54 (made of polypropylene). On the substrate 54, a pair of stainless plates (not shown) were provided to be substantially in parallel to each other as a spacer, and the sample 51 was placed between these stainless plates. The distance between the paired stainless plates was 0.3 mm, and the thickness of each stainless plate was 0.15 mm. The sample 51 was mountain-folded at a folding portion 51a around the center so that a right portion 51b on one side of the folding portion 51a (on the right side in FIG. 7) opposed a left portion 51c on the other side of the folding portion 51a (on the left side in FIG. 7). When the polyimide film 51 was mountain-folded, the shape-retaining film was on the outer side in each of Examples A1 to A7.

Figure 8:
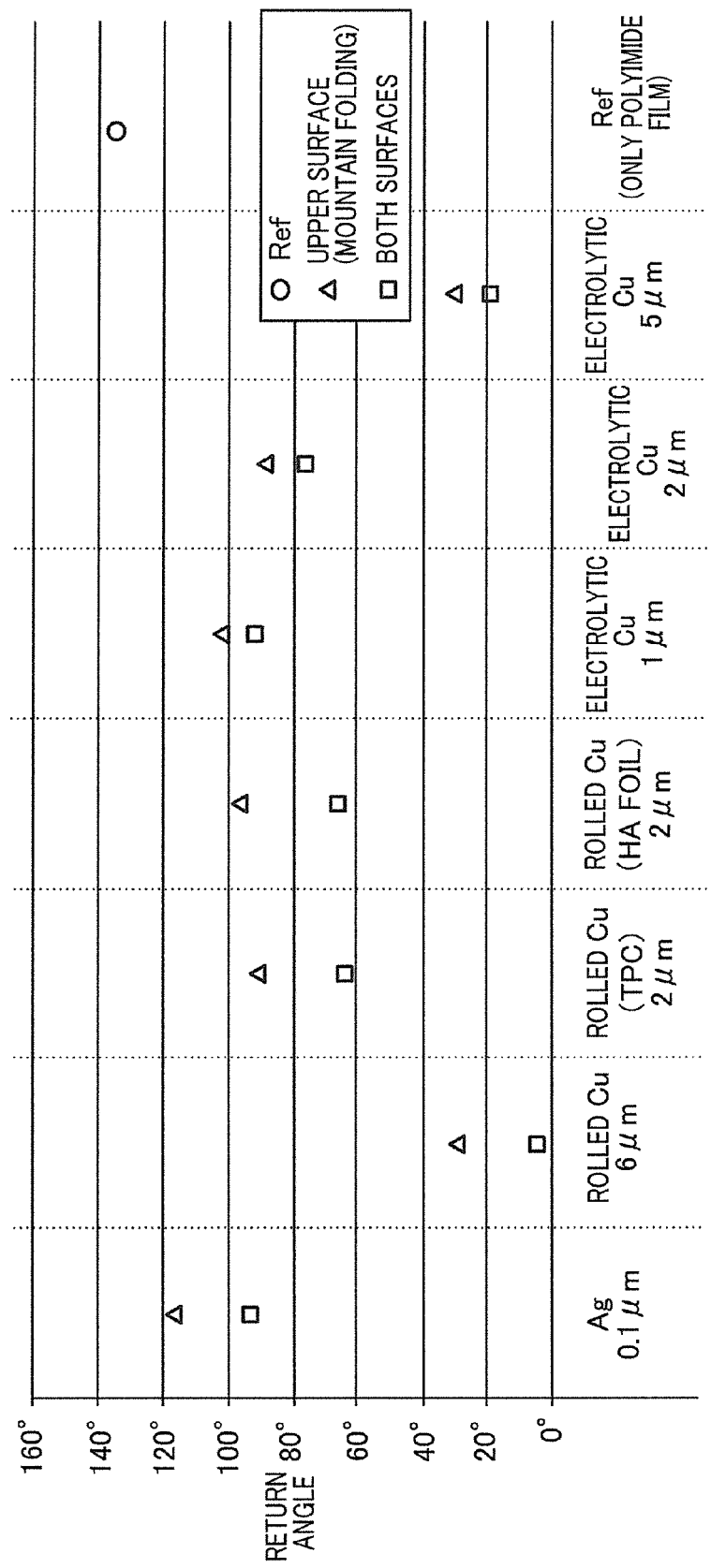
FIG. 8 is a graph showing experimental results of Table 1.

While the folded sample 51 was placed on the substrate 54 as above, the polyimide film 51 was pressed for five seconds with a predetermined pressurizing force (0.1 MPa), by a silicon rubber plate 53 from above. The angle between the right portion 51b and the left portion 51c after one minute passed was measured as a return angle. The measurement results are shown in Table 1. The measurement results in Table 1 are indicated as graphs in FIG. 8.

angle was 31°. This indicates that a further preferable result is achieved when the thickness of the metal layer is 5 μm or greater.

When Examples A1 to A7 are compared with Examples B1 to B7, the return angles of Examples B1 to B7 were small. This indicates that, when a shape-retaining film is pasted onto both surfaces of a flexible wiring board, a shape-retaining flexible wiring board with a high shape retaining effect may be formed.

REFERENCE SIGNS LIST 1, 1A, 1C, 1D, 1E SHAPE-RETAINING FILM
2 PROTECTIVE LAYER
3 METAL LAYER
4 ADHESIVE LAYER
41 PLATING LAYER
8 FLEXIBLE WIRING BOARD
10, 10A, 10B, 10C, 10D, 10E SHAPE-RETAINING FLEXIBLE WIRING BOARD

The invention claimed is:
1. A shape-retaining film which is to be joined with a flexible wiring board, comprising:
a plastic-deformable metal layer; and
an adhesive layer which is formed on one surface side of the metal layer and by which the plastic-deformable metal layer is to be joined with the flexible wiring board,
wherein when the metal layer is joined with the flexible wiring board, the metal layer substantially maintains the shape of the flexible wiring board by virtue of plastic deformation of the metal layer in accordance with deformation of the flexible wiring board.

TABLE 1

| Ref | Ag 0.1 μm | | ROLLED Cu 6 μm | | ROLLED Cu (TPC) 2 μm | | ROLLED Cu (HA FOIL) 2 μm | | ELECTROLYTIC Cu 1 μm | | ELECTROLYTIC Cu 2 μm | | ELECTROLYTIC Cu 5 μm | |
|---|---|---|---|---|---|---|---|---|---|---|---|---|---|---|
| | UPPER SURFACE | BOTH SURFACES | UPPER SURFACE | BOTH SURFACES | UPPER SURFACE | BOTH SURFACES | UPPER SURFACE | BOTH SURFACES | UPPER SURFACE | BOTH SURFACES | UPPER SURFACE | BOTH SURFACES | UPPER SURFACE | BOTH SURFACES |
| (ONLY POLYIMIDE FILM) COMPARATIVE EXAMPLE C1 | EXAMPLE A1 | EXAMPLE B1 | EXAMPLE A2 | EXAMPLE B2 | EXAMPLE A3 | EXAMPLE B3 | EXAMPLE A4 | EXAMPLE B4 | EXAMPLE A5 | EXAMPLE B5 | EXAMPLE A6 | EXAMPLE B6 | EXAMPLE A7 | EXAMPLE B7 |
| 134 | 117 | 93 | 29 | 5 | 90 | 63 | 96 | 66 | 102 | 91 | 89 | 76 | 31 | 19 |

In Table 1, as compared to the return angle in Comparative Example C1 was 134°, the return angles in Examples A1 to A7 and B1 to B7 were significantly small. This indicates that the folded shape of a flexible wiring board can be maintained when a shape-retaining film having a plastically deformable metal layer made of silver, copper, or the like is pasted onto a flexible wiring board. In particular, in Example A5, the return angle was 102° which was significantly smaller than the return angle of Comparative Example C1. This indicates that a preferable result is achieved when the thickness of the metal layer is 1 μm or greater. Furthermore, in Examples A3, A4, and A6, the return angles were around 90°. This indicates that a more preferable shape retaining property is achieved when the thickness of the metal layer is 2 μm or greater. Furthermore, in Example A7 the return 2. The shape-retaining film according to claim 1, wherein the metal layer is mainly made of at least one of copper, silver, nickel, and aluminum.

3. The shape-retaining film according to claim 1, wherein the thickness of the metal layer is 0.1 μm to 12 μm.

4. The shape-retaining film according to claim 1, wherein the adhesive layer is conductive.

5. The shape-retaining film according to claim 1, wherein in the metal layer, a protective layer is formed on a side opposite to a side where the adhesive layer is provided.

6. The shape-retaining film according to claim 1, wherein in the metal layer, another adhesive layer is further formed on a side opposite to a side where the adhesive layer is provided.

7. The shape-retaining film according to claim 6, wherein the another adhesive layer formed on the side opposite to the side where the adhesive layer is provided in the metal layer is conductive.

8. The shape-retaining film according to claim 1, wherein the metal layer is subjected to a corrosion resistance surface treatment.

9. A shape-retaining flexible wiring board, wherein the shape-retaining film according to claim 1 is joined with the flexible wiring board by the adhesive layer.

10. The shape-retaining film according to claim 1, wherein the metal layer has been formed by rolling.

* * * * *